United States Patent
Kaminaga et al.

(10) Patent No.: US 10,453,524 B2
(45) Date of Patent: Oct. 22, 2019

(54) NAND FLASH MEMORY DEVICE PERFORMING CONTINUOUS READING OPERATION USING NOR COMPATIBLE COMMAND, ADDRESS AND CONTROL SCHEME

(71) Applicant: Winbond Electronics Corp., Taichung (TW)

(72) Inventors: Takehiro Kaminaga, Kanagawa (JP); Katsutoshi Suito, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/614,631

(22) Filed: Jun. 6, 2017

(65) Prior Publication Data

US 2018/0090202 A1 Mar. 29, 2018

(30) Foreign Application Priority Data

Sep. 27, 2016 (JP) .................................. 2016-187885

(51) Int. Cl.
*G11C 7/10* (2006.01)
*G11C 11/56* (2006.01)
(Continued)

(52) U.S. Cl.
CPC ........ *G11C 11/5642* (2013.01); *G11C 7/1051* (2013.01); *G11C 16/0483* (2013.01);
(Continued)

(58) Field of Classification Search
CPC .............. G11C 11/5642; G11C 7/1051; G11C 11/4085
See application file for complete search history.

(56) References Cited

U.S. PATENT DOCUMENTS 7,210,020 B2   4/2007   Blodgett
8,976,621 B2   3/2015   Zhang et al.
(Continued)

FOREIGN PATENT DOCUMENTS

CN   101686491   3/2010
CN   105825894   8/2016
(Continued)

OTHER PUBLICATIONS

"Office Action of Japan Counterpart Application," dated Jul. 25, 2017, p. 1-p. 8.
(Continued)

*Primary Examiner* — Mushfique Siddique
(74) *Attorney, Agent, or Firm* — JCIPRNET

(57) ABSTRACT

A semiconductor memory device, a flash memory and a continuous reading method thereof are provided for achieving a continuous reading of pages in high speed. A flash memory of the invention includes a memory cell array; a page reading element, which selects a page of the memory cell array and reads out data of the selected page to a page buffer/sense circuit; a page information storage element, which stores page information related to a range of a continuous reading; and a control element, which controls the continuous reading of the page. The control element determines whether to resume the continuous reading according to the page information. When it is determined to resume the continuous reading, the continuous reading can still be performed without a page data read command and a page address being inputted even if a chip select signal is toggled.

19 Claims, 9 Drawing Sheets

(51) Int. Cl.
*H03K 19/08* (2006.01)
*G11C 16/04* (2006.01)
*G11C 16/26* (2006.01)
*G11C 16/32* (2006.01)
*G11C 29/46* (2006.01)

(52) U.S. Cl.
CPC .............. *G11C 16/26* (2013.01); *G11C 16/32* (2013.01); *G11C 29/46* (2013.01); *H03K 19/08* (2013.01)

(56) References Cited

U.S. PATENT DOCUMENTS

| | | | | |
|---|---|---|---|---|
| 2004/0052124 | A1* | 3/2004 | Sudo | G11C 7/062 |
| | | | | 365/200 |
| 2004/0236898 | A1* | 11/2004 | Okumura | G11C 7/1018 |
| | | | | 711/103 |
| 2006/0224789 | A1* | 10/2006 | Cho | G11C 7/1039 |
| | | | | 710/52 |
| 2006/0268609 | A1 | 11/2006 | Kim et al. | |
| 2008/0126776 | A1* | 5/2008 | Takayama | G06F 9/4401 |
| | | | | 713/1 |
| 2008/0209108 | A1* | 8/2008 | Pyeon | G06F 12/0893 |
| | | | | 711/103 |
| 2009/0168530 | A1* | 7/2009 | Yamamura | G11C 7/22 |
| | | | | 365/185.13 |
| 2009/0196102 | A1* | 8/2009 | Kim | G11C 7/1045 |
| | | | | 365/185.11 |
| 2012/0230106 | A1* | 9/2012 | Yano | G11C 16/08 |
| | | | | 365/185.11 |
| 2013/0145093 | A1* | 6/2013 | Kaminaga | G11C 7/1051 |
| | | | | 711/114 |
| 2014/0104947 | A1* | 4/2014 | Yamauchi | G11C 16/0483 |
| | | | | 365/185.09 |
| 2016/0189789 | A1* | 6/2016 | Jigour | G11C 29/04 |
| | | | | 365/185.09 |

FOREIGN PATENT DOCUMENTS

| | | |
|---|---|---|
| JP | 2006286179 | 10/2006 |
| JP | 2006331408 | 12/2006 |
| JP | 2008134736 | 6/2008 |
| JP | 2015008021 | 1/2015 |
| KR | 100626391 | 9/2006 |
| KR | 100630827 | 10/2006 |
| TW | I276956 | 3/2007 |
| TW | I493546 | 7/2015 |

OTHER PUBLICATIONS

"Office Action of Korean Counterpart Application," dated Sep. 18, 2018, with English translation thereof, pp. 1-11.
"Office Action of Korea Counterpart Application," dated Mar. 27, 2019, p. 1-p. 13.

* cited by examiner

NAND FLASH MEMORY DEVICE PERFORMING CONTINUOUS READING OPERATION USING NOR COMPATIBLE COMMAND, ADDRESS AND CONTROL SCHEME

CROSS-REFERENCE TO RELATED APPLICATION

This application claims the priority benefit of Japan application serial no. 2016-187885, filed on Sep. 27, 2016. The entirety of the above-mentioned patent application is hereby incorporated by reference herein and made a part of this specification.

BACKGROUND OF THE INVENTION

1. Field of the Invention

The invention relates to a semiconductor memory device such as a flash memory, and more particularly, to a continuous reading of one or more pages.

2. Description of Related Art

In comparison with NOR flash memories, NAND flash memories can realize a memory cell array with high integration, and is therefore suitable for storing large volume data such as image data or music data. On the other hand, because it is required to read data from the memory cell array to a page buffer, a time required for reading becomes longer as compared to the NOR flash memories.

For flash memories in recent years, a memory with a serial interface that realizes data input/output in high speed with fewer terminals have become popularized. The serial interface requires, for example, a standard SPI (Serial Peripheral Interface) with an 8-bit command code and a 24-bit address. Patent Document 1 discloses a serial flash memory with the capability of expanding addresses without changing the SPI protocol.

PRIOR ART DOCUMENT

Patent Document

Patent Document 1: Japanese Patent Publication No. 2015-8021

Problems to be Solved by the Invention

The NOR flash memory can perform a continuous reading of data as in a so-called burst mode. FIG. 1(A) shows a timing chart of a continuous reading operation of this kind of flash memory. When a chip select signal CS is in low level, the flash memory becomes active, such that a read command and an address can be inputted from an input terminal in synchronism with rising of a serial clock. The flash memory enables an automatic increment on addresses, and sequentially outputs read data from an output terminal in synchronism with dropping of the serial clock. When the chip select signal CS is in high level, the flash memory enters a non-select (standby) state, and the continuous reading of data is suspended.

On the other hand, in the NAND flash memory, the memory with the serial interface is now a practical application for achieving a compatibility with NOR serial flash memory. Unlike the NOR flash memory, because the NAND memory needs to temporarily read out data from a page of a memory cell array to a page buffer/sense circuit, a specific instruction or command is required for achieving the same. Hereinafter, the specific instruction is also referred to as "a page data read command". Further, when the continuous reading is performed in the NAND flash memory, the page data read command and a page address where the reading starts must be inputted, and a read command for serially outputting data held by the page buffer/sense circuit must be inputted after a latency, which is equivalent to a period when the data is read from the page of the memory cell array.

To continuously perform serial input/serial output of the data, the NAND flash memory is provided with a data register (or a high speed cache register) for holding data forwarded from the page buffer/sense circuit and a two-stage pipe line composed of the page buffer/sense circuit and the data register. During the continuous reading, the pages automatically increase, and page data is sequentially forwarded to the page buffer/sense circuit. In this period, the data held by the data register are outputted to the outside in synchronism with the serial clock.

FIG. 1(B) shows a timing chart of a continuous reading operation of the NAND flash memory. When the chip select signal CS becomes low active, an 8-bit page data read command (e.g., "13h") and a 16-bit page address PA (for selecting a row address of a block and the page) are inputted from a host device, and an 8-bit read command and a 16-bit address (which is an empty dummy address) for the continuous reading are inputted after a latency, which is equivalent to a time for forwarding the data of the selected page of the memory cell array to the page buffer/sense circuit. The NAND flash memory enters a continuous reading mode after a series of the commands and the addresses being inputted. The inputted page address PA automatically increase, and the read page data is serially outputted to the outside in synchronism with the serial clock. In a period when the chip select signal CS is in low level (i.e., during the continuous reading mode), inputting of the page data read command and the page address PA is not required for the flash memory.

When the chip select signal CS is toggled to be in H level, the continuous reading operation is ended. When the continuous reading is resumed, the chip select signal CS is set to be in L level, the page data read command "13h" and the page address PA are inputted again, and then the read command and the address for the continuous reading are inputted after a specific latency. In this way, the continuous reading is ended when the chip select signal CS is toggled.

Furthermore, in general usage of the flash memory with the serial interface, a data volume readable each time is restricted by the high speed cache register of a CPU (Central Processing Unit) at the host device side. That is to say, once the high speed cache register of the CPU is fully occupied by the data from the flash memory, the host device sets the chip select signal CS to be in H level such that the continuous reading of the flash memory is suspended. In this period, the CPU processes the data held by the high speed cache register. When data processing is completed by the CPU, the host device sets the chip select signal CS to be in L level, and accesses the flash memory again to resume the continuous reading.

FIG. 2 shows a relationship diagram in a situation where 10 K byte data is read from the NOR flash memory when the high speed cache register of the CPU is 1 K byte. Data is outputted from the flash memory to the host device when the command and the address for the continuous reading are inputted to the flash memory, and the host device sets the chip select signal CS to be in H level when the data volume reaches 1 K byte. In this period, the 1 K byte data held by the high speed cache register is processed. Next, the host device sets the chip select signal CS to be in L level, and outputs the command and the address for the continuous reading again to receive 1 K byte data from the flash memory.

When the continuous reading is performed in the NAND flash memory, it is also expected that the same command and address used in the NOR can be inputted when the chip select signal CS is toggled in order to achieve a high compatibility with the NOR flash memory. Moreover, to achieve the continuous reading in high speed, it is intended to avoid inputting of the page data read command or the page address each time when the chip select signal CS is toggled.

SUMMARY OF THE INVENTION

The invention aims to provide a semiconductor memory device capable of realizing the continuous reading in high speed for solving the conventional matter.

Technical Means for Solving the Matter

A semiconductor memory device of the invention includes: a memory cell array; a page reading element, for selecting a page of the memory cell array and reading out data of the selected page to a data holding part; a setting element, for setting page information related to a range of a continuous reading of the page; and a control element, for controlling the continuous reading of the page of the page reading element, wherein the control element determines whether to resume a continuous reading mode based on the page information. Preferably, the control element determines to resume the continuous reading mode when the page selected by the page reading element during the continuous reading is within a page range defined by the page information, and the control element determines not to resume the continuous reading mode when the selected page is outside the page range. Preferably, if determining not to resume the continuous reading mode, the control element ends the continuous reading in response to an external control signal being disabled, and if determining to resume the continuous reading mode, the control element is capable of performing the continuous reading without a page data read command being inputted when the external control signal being disabled is immediately enabled. Preferably, if determining to resume the continuous reading mode, the control element stores a page address and a column address when the external control signal is disabled and continues to hold the data read out by the page reading element, and the control element outputs the data held by the page reading element based on the stored page address and the column address when the external control signal is enabled. Preferably, the setting element sets at least one pair of a minimum page address and a maximum page address as the page information. Preferably, the setting element sets a burst length for defining a number of pages used in the continuous reading as the page information.

A NAND flash memory of the invention includes: an NAND memory cell array; a page buffer, for holding data forwarded from a selected page of the memory cell array or holding to-be-programmed data; a data register, capable of performing a bidirectional data transceiving with the page buffer; a continuous reading element, for continuously reading out a page of the memory cell array and serially outputting read data through the data register in synchronism with a serial clock; and a setting element, for setting page information related to a range of a continuous reading. The setting element is capable of performing the continuous reading within a page range defined by the page information without a page data read command.

The continuous reading method for the pages in the NAND flash memory of the invention is to set the page information related to the range of the continuous reading. The continuous reading can be performed without a page data read command even if an external control signal is disabled when the continuous reading is performed within the range defined by the page information.

Effect of the Invention

According to the present invention, the page information related to the range of the continuous reading is set, and whether to resume the continuous reading is determined based on the page information. As a result, if it is determined to resume the continuous reading mode, even if the continuous reading is suspended due to the external control signal being toggled, the continuous reading can still be resumed later without the page data read command.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
FIG. 1(A) is a diagram roughly illustrating the continuous reading operation of the NOR flash memory.

Reference will now be made in detail to the present preferred embodiments of the invention, examples of which are illustrated in the accompanying drawings. Wherever possible, the same reference numbers are used in the drawings and the description to refer to the same or like parts.

Embodiments of the invention are described in detail below by reference with accompanied figures. A semiconductor memory device of the invention may be an NAND flash memory or a semiconductor memory device embedded with said flash memory. In a preferred embodiment, the NAND flash memory is provided with a serial interface. Nonetheless, the NAND flash memory may also be provided with both the serial interface and a parallel interface. The serial interface includes, for example, a terminal for inputting a serial clock SCK, a terminal for inputting serial data, a terminal for outputting the serial data, a terminal for chip selection, a write protect terminal, terminals for powers Vdd and GND, etc. Bit widths of the terminal for inputting the serial data and the terminal for outputting the serial data are not limited only to be ×1 but can also be ×4 or ×8. In the serial interface, when a chip select signal CS is asserted to low level, inputting/outputting of data or inputting of command or address is performed in synchronism with the external serial clock SCK.

EMBODIMENTS

Figure 3:
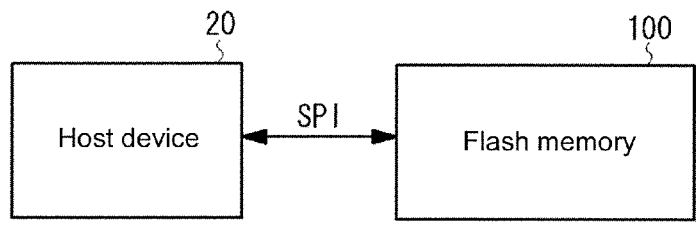
FIG. 3 is a diagram illustrating a structure of a system according to an embodiment of the invention.

Next, embodiments of the invention are described as follows. FIG. 3 is an example of a system according to the embodiment of the invention. A system 10 of the present embodiment includes a host device 20 and an NAND flash memory 100. The flash memory 100 is connected to the host device 20 via a SPI serial interface or the like. The host device 20 may be, for example, a processor, a controller, a computer, etc. The system 10 may be all or a part of a packaged semiconductor device, a computer device, a computer system, a storage device, a storage system, etc.

Figure 4:
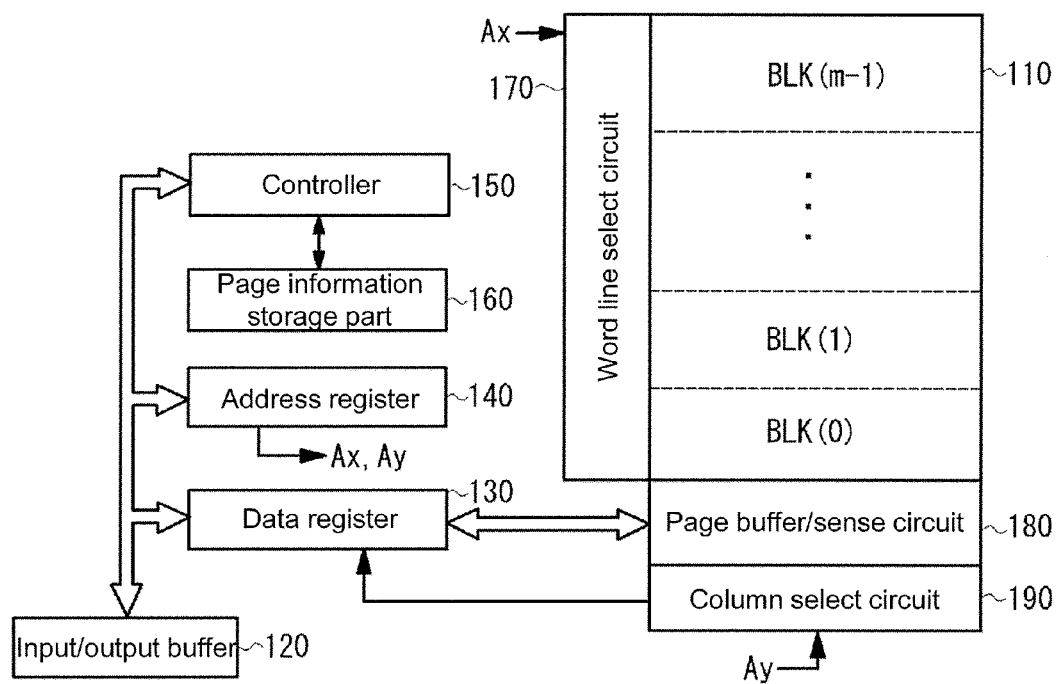
FIG. 4 is a diagram illustrating a structure of an NAND flash memory corresponding to a serial interface according to an embodiment of the invention.

FIG. 4 is a structure of the NAND flash memory 100 according to the present embodiment. The flash memory 100 includes: a memory cell array 110, formed with a plurality of memory cells arranged in matrix; an input/output buffer 120, connected to an external terminal; a data register 130, for receiving data from the input/output buffer 120, or outputting data to the input/output buffer 120; an address register 140, for receiving address data from the input/output buffer 120; a control element 150, for controlling reading, programming, erasing, etc., based on the instruction (command) from the input/output buffer 120 or an external control signal (the chip select signal CS, a write protect signal WP, etc.); a page information storage element 160, for storing page information related to a range of a continuous reading; a word line select circuit 170, for decoding row address information Ax from the address register 140, and selecting a block or a page of the memory cell array 110 based on a decoding result; a page buffer/sense circuit 180, for holding read data via a bit line, or holding to-be-programmed data via the bit line; and a column select circuit 190, for decoding column address information Ay from the address register 140, and selecting the bit line based on a decoding result. Further, despite the lack of illustration, the flash memory 100 can include an internal voltage generating circuit. The internal voltage generating circuit generates voltages required for reading, programming (writing) and erasing data (a program voltage Vpgm, a pass voltage Vpass, a read voltage Vread, an erase voltage Vers (including an erase pulse)).

Figure 5:
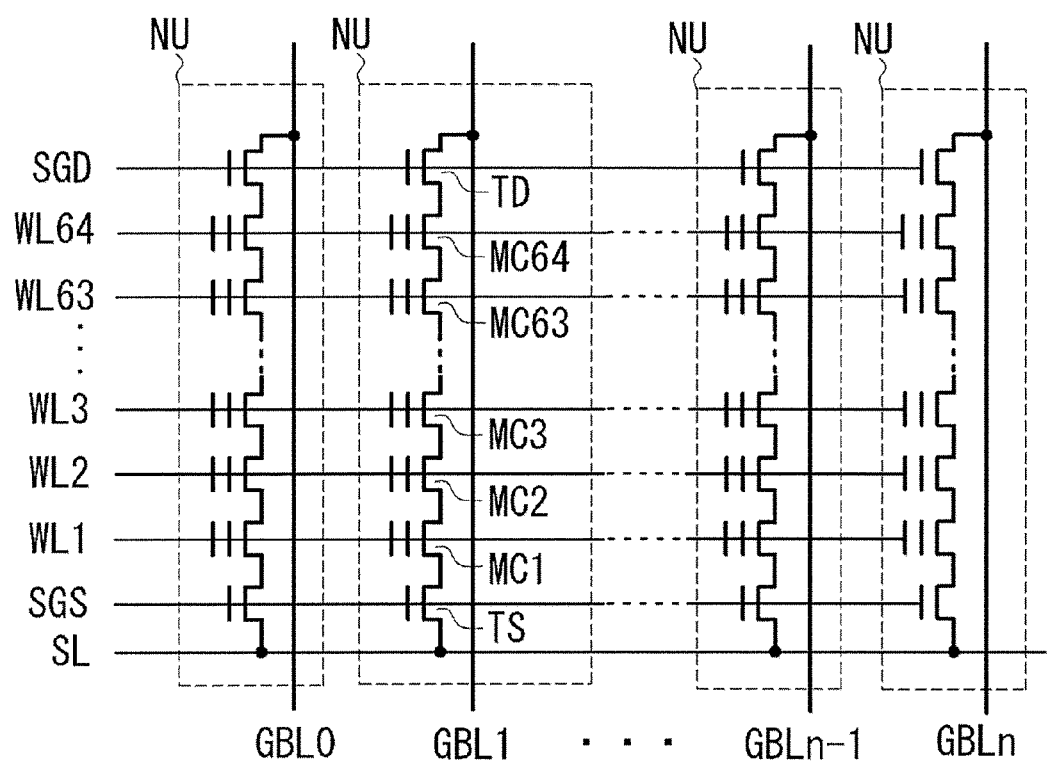
FIG. 5 is a diagram illustrating a structure of NAND strings.

The memory cell array 110 includes a plurality of blocks (e.g., block 0 to block 1023). In one block, as shown in FIG. 5, n+1 (e.g., 2 KB) NAND strings NU formed by serially connecting memory cells together are arranged along a row direction. One NAND string NU includes: a plurality of memory cells $MC_i$ (i=1, 2, 3 . . . , 64) connected in series; a bit line side select transistor TD, connected to one of the ends (i.e., a drain side of the memory cell MC64); and a source line side select transistor TS, connected to a source side of the memory cell MC0. A drain of the bit line side select transistor TD is connected to one corresponding bit line GBL among bit lines GBL0 to GBLn, and a source of the source line select transistor TS is connected to a common source line SL.

Table 1 is a table showing bias voltages applied in each operation of the flash memory. During a reading operation, a specific positive voltage is applied to the bit line; a specific voltage (e.g., 0 V) is applied to a selected word line; the pass voltage Vpass (e.g., 4.5 V) is applied to a non-selected word line; a positive voltage (4.5 V) is applied to selected gate lines SGD and SGS such that the bit line side select transistor TD and the source line side select transistor TS are turned on; and the common source line is set as 0 V. During a programming operation, the program voltage Vpgm (15 V to 20 V) of a high voltage is applied to the selected word line; an intermediate potential (e.g., 10 V) is applied to the non-selected word line such that the bit line side select transistor TD is turned on and the source line side select transistor TS is turned off; and an electric potential corresponding to data "0" or "1" is provided to the bit line GBL. During an erasing operation, 0 V is applied to the selected word line in the block, and a high voltage (e.g., 20 V) is applied to a P-well to extract electrons of the floating gate to a substrate, so as erase data using block as a unit.

TABLE 1

|  | Erasing | Writing | Reading |
|---|---|---|---|
| Selected word line | 0 | 15~20 V | 0 |
| Non-selected word line | F | 10 V | 4.5 |
| SGD | F | Vcc | 4.5 |
| SGS | F | 0 | 4.5 |
| SL | F | Vcc | 0 |
| P-well | 20 | 0 | 0 |

The page buffer/sense circuit 180 includes a latch circuit. The latch circuit holds data read out from the memory cell array 110, or holds data to be programmed to the memory cell array 110. The latch circuit can hold data of one page (e.g., 2 KB).

The latch circuit of the page buffer/sense circuit 180 is connected to the data register 130 through a forwarding circuit capable of performing a bidirectional data forwarding. The data register 130 can hold the data of one page, as similar to the latch circuit. Each of the latch circuit and the data register 130 is provided with a first high speed cache part and a second high speed cache part and can independently forward data of the first high speed cache part and the second high speed cache part. For example, data held by the first high speed cache part of the latch data can be forwarded to the first high speed cache part of the data register 130, or data held by the second high speed cache part of the latch circuit can be forwarded to the second high speed cache part of the data register 130.

Figure 6A:
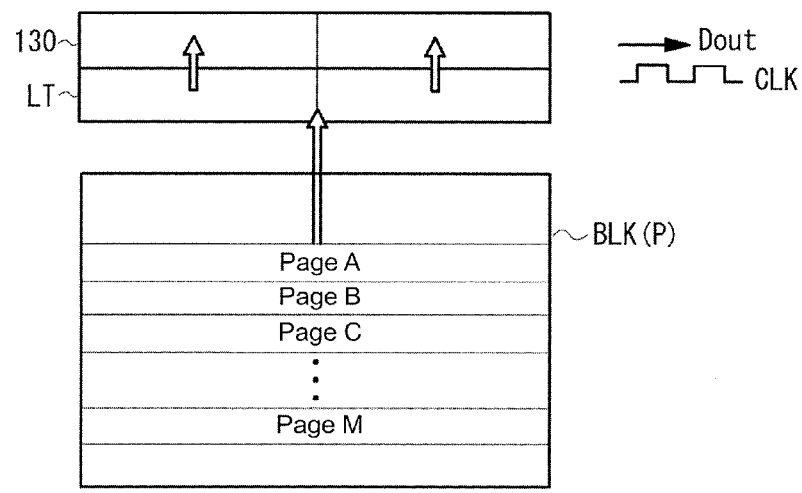
FIG. 6(A) and FIG. 6(B) are diagrams illustrating operations of a latch circuit and a data register of a page buffer/sense circuit during the continuous reading operation of the flash memory according to the embodiment.

A two-stage pipe line composed of the latch circuit and the data register 130 of the page buffer/sense circuit 180 can be used to achieve the continuous reading of the page in high speed. For example, as shown in FIG. 6(A), it is assumed herein that the continuous reading is to be performed on from a page A, a page B, . . . , to a page M of a block (P). First of all, data of the page A is forwarded to a latch circuit LT of the page buffer 180. Next, the data of said page is forwarded to the data register 130. Next, in a period for serially outputting the data held by the data register 130, data of the next page B is forwarded to the latch circuit LT.

Figure 6B:
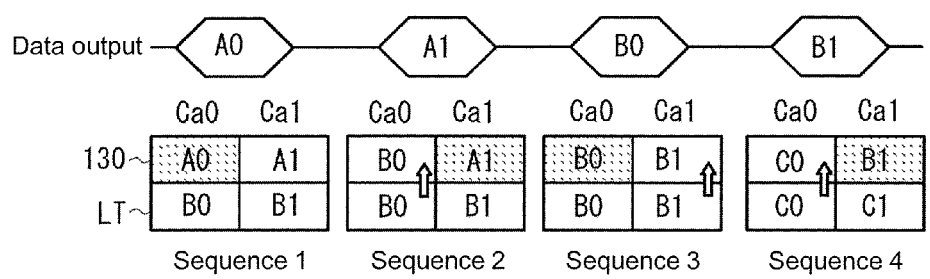

FIG. 6(B) shows detailed operations of first high speed cache parts Ca0 and second high speed cache parts Ca1 of the latch circuit LT and the data register 130. Each of the first high speed cache parts Ca0 and the second high speed cache parts Ca1 holds data of ½ page, where each of A0, A1, B0, B1, C0 and C1 is the ½ page.

The page data A0 is outputted from the first high speed cache part Ca0 of the data register 130 in Sequence 1, and the page data A1 is outputted from the second high speed cache part Ca1 of the data register 130 in Sequence 2. At the time, the page data B0 is forwarded from the first high speed cache part Ca0 of the latch circuit L1 to the first high speed cache part Ca0 of the data register 130. In Sequence 3, in a period for outputting the page data B0 of the first high speed cache part Ca0 of the data register 130, the page data B1 of the second high speed cache part Ca1 of the latch circuit LT is forwarded to the second high speed cache part Ca1 of the data register 130. In Sequence 4, in a period for outputting the page data B1 of the second high speed cache part Ca1 of the data register 130, the page data C0 of the first high speed cache part Ca0 of the latch circuit LT is forwarded to the first high speed cache part Ca0 of the data register 130. The data read from the data register 130 is forwarded to the input/output buffer 120 in synchronism with an internal clock CLK, and the forwarded data is serially outputted from an external output terminal in synchronism with the external serial clock SCK.

The flash memory 100 of the present embodiment can set the page information related to the range of the continuous reading and the set page information is stored in the page information storage element 160. The page information storage element 160 can be set to be any storage area such as any one of the memory cell array 110, the register and other storage areas (more preferably, a non-volatile storage area). The page information is, preferably, defined a page range for the continuous reading, and the page information is used to determine whether to resume a continuous reading mode.

In one preferred example, the page information includes one pair or multiple pairs of a minimum page address (LSP) and a maximum page address (MSP). Table 2 shows an example of the page information stored in the page information storage element of the flash memory according to the first embodiment of the invention. In the example shown in Table 2, two pairs of LSP and MSP are set. Set 1 is set with the page range having LSP defined by "Page 0 of Block 0" and MSP defined by "Page 63 of Block 3", and Set 2 is set with the page range having the page range having LSP defined by "Page 8 of Block 15" and MSP defined by "Page 20 of Block 15". These page ranges correspond to data volumes for the continuous reading. The pairs of LSP and MSP can be set to be within one block or across multiple blocks.

TABLE 2

|  | Set 1 | Set 2 | . . . | Set n |
|---|---|---|---|---|
| LSP | Block 0 Page 0 | Block 15 Page 8 |  |  |
| MSP | Block 3 Page 63 | Block 15 Page 20 |  |  |

Figure 7:
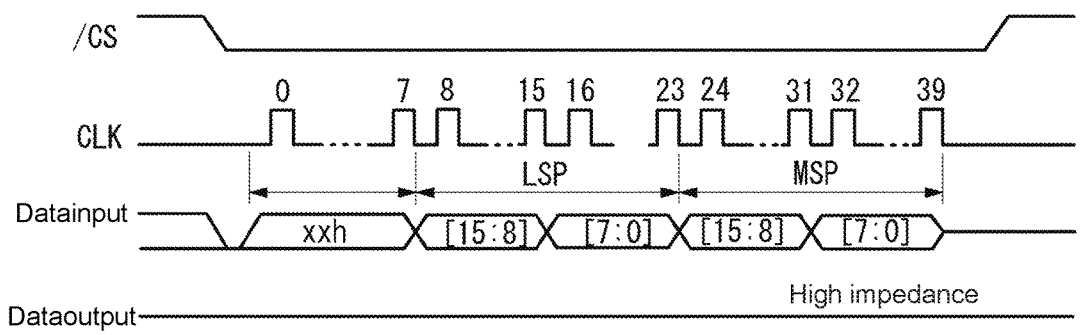
FIG. 7 is a timing chart illustrating a setting operation of page information of the flash memory according to the first embodiment of the invention.

Next, FIG. 7 shows an example for setting the page information. In a period where the chip select signal CS is asserted to low, a command "xxh" for setting the page information is inputted together with LSP and MSP in response to the serial clock SCK. In the illustrated example, for corresponding to SPI, the command is 8-bit, and each address of LSP and MSP is 16-bit. When the command "xxh" for programming the page information is received, the control element 150 programs the subsequently inputted page addresses of LSP and MSP into the page information storage element 160 based on said command. When multiple pairs of LSP and MSP are present, the setting operation shown by FIG. 7 is repeated multiple times so the control element 150 can store the pairs of LSP/MSP into Set 1, Set 2, . . . , Set n. When the preset for the page information is ended, during the continuous reading, the control element 150 determines whether to resume the continuous reading mode according to the page information.

Figure 8:
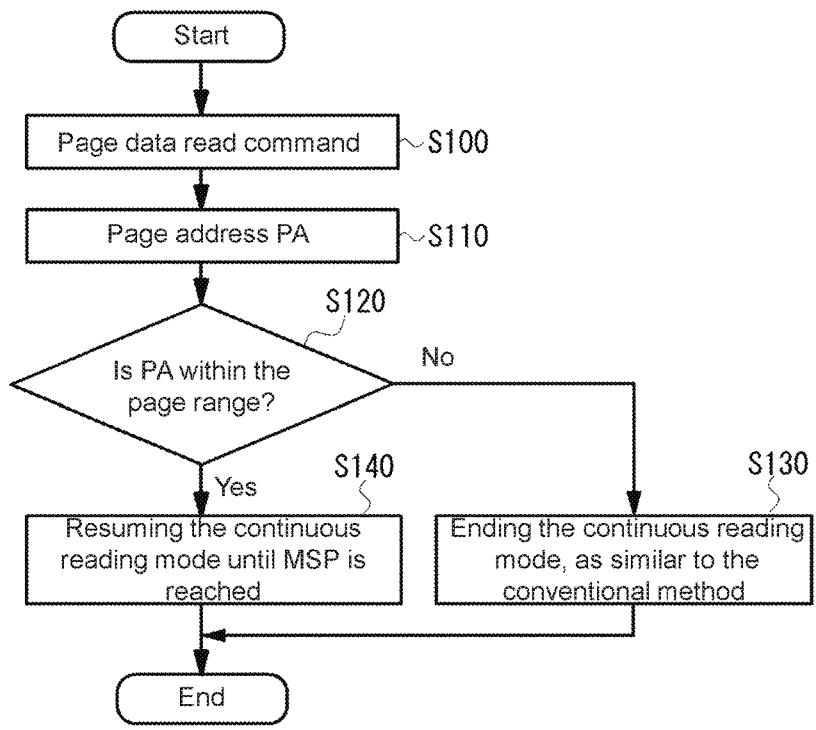
FIG. 8 is a flowchart illustrating the continuous reading operation of the flash memory according to the first embodiment of the invention.

Next, the continuous reading operation of the flash memory of the present embodiment is described with reference to the flowchart of FIG. 8. When the chip select signal CS is asserted to low level, a page data read command (e.g., "13h") and a page address PA are inputted from the host device 20 to the flash memory 100 in synchronism with the serial clock (S100 and S110). The control element 150 selects a page designated by the page address PA from the memory cell array 110 in response to the page data read command, and reads out the selected data to the page buffer/sense circuit 180. Said inputted page address PA becomes an address of a page firstly selected during the continuous reading.

Next, the control element 150 determines whether the page address PA is within the page range defined by LSP/MSP according to the page information of the page information storage element 160 (S120). If the page address PA is outside the page range, the control element 150 ends the continuous reading mode (S130), as similar to the conventional method shown in FIG. 1(B). That is to say, when the chip select signal CS is changed into high level, the continuous reading is ended. At the time, the data held by the page buffer/sense circuit 180 becomes to be indefinite, or the data held by the page buffer/sense circuit 180 is reset. That is to say, when the chip select signal CS is changed into high level, there is no way of knowing at which column address of which page outputting of the data is ended, which is therefore treated as through it is indefinite or reset. When the chip select signal CS is subsequently changed into low level, the page data read command "13h" and the page address PA must be inputted again.

Figure 2:
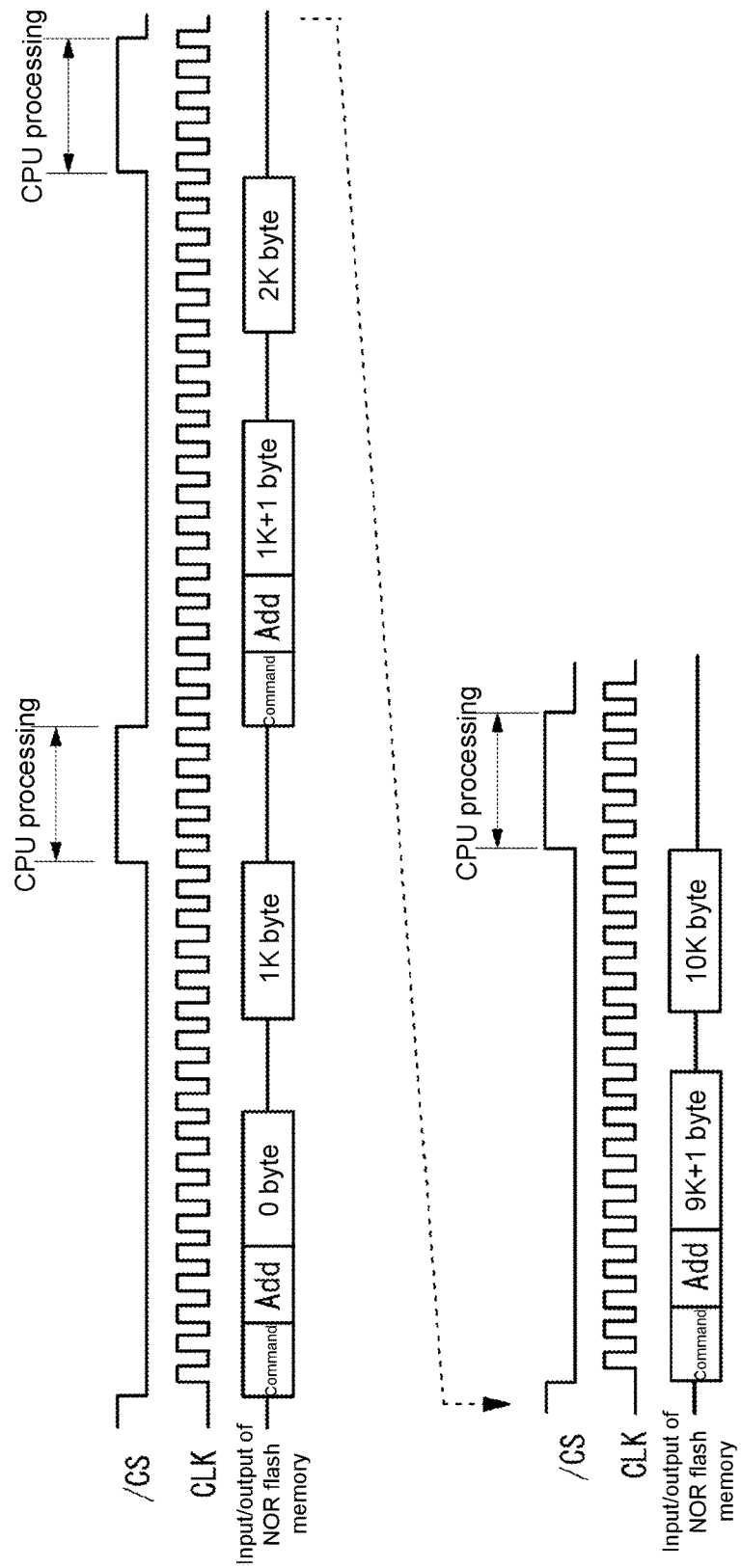
FIG. 2 is a diagram illustrating the flash memory provided with functions of the serial interface in general usage.

On the other hand, if the page address PA is within the page range, it is determined to resume the continuous reading mode (S140). That is, after the chip select signal CS is changed into high level so the continuous reading is suspended, when the chip select signal CS is changed into low level, the continuous reading can be resumed without the page data read command "13h" and the page address PA being inputted. Specifically, if the control element 150 determines to resume the continuous reading mode, when the chip select signal CS is changed into high level, the last read page address and column address are stored. Then, the data of the page buffer/sense circuit 180 and the data of the data register 130 are not reset but held as they were. When chip select signal CS is transitioned to low level and a subsequent read command is inputted, the control element 150 resumes reading at the next column address of the page where the reading is suspended according to the stored page address and the column address. That is why inputting of the page data read command "13h" and the page address PA is not required. Further, as shown in FIG. 2, in a period where the chip select signal CS is in high level, the host device 20 can performing processing on the high speed cache register of the CPU. The continuous reading mode resumes until the selected page is identical to MSP.

Figure 9A:
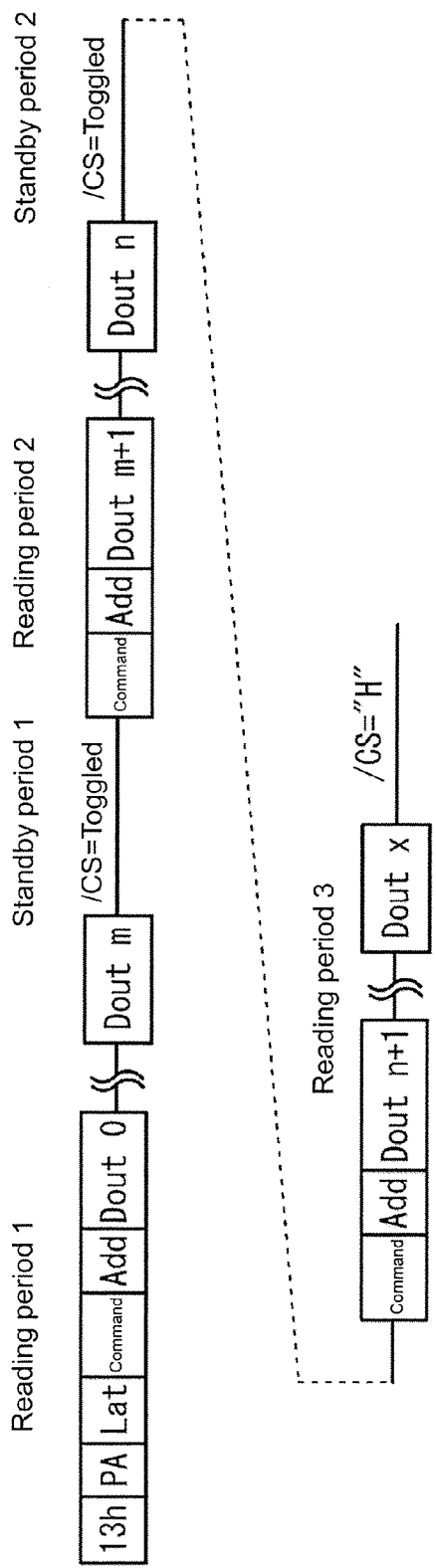
FIG. 9(A) and FIG. 9(B) are timing charts illustrating timing sequences of the continuous reading operation of the flash memory according to the embodiment.

FIG. 9(A) is a timing chart of the continuous reading when the page address PA is within the page range. In (the first) Reading period 1, the page data read command ("13h") and the page address PA are inputted, and data of the page designated by the page address PA is read out from the memory cell array 110 to the page buffer/sense circuit 180. After a latency Lat that is equivalent to aforesaid reading period, the command and the address for the continuous reading are inputted. Further, in the NAND flash memory, reading are perform using the page as a unit, and the column address is read starting from a designated address during the continuous reading. Accordingly, if it is intended to use only functions of the continuous reading, said address is actually not required so a dummy (empty) address can be inputted instead. Thus, the flash memory 100 serially outputs the page data (Dout 0~Dout in) stating from the page address PA to the host device 20 in synchronism with the external serial clock SCK.

The host device 20 receives the data serially outputted from the flash memory 100 by the high speed cache register. When the high speed cache register has no remaining capacity, in a period when the CPU processes the data in the high speed cache register, the chip select signal CS is changed into H level (Standby period 1). The flash memory 100 suspends the continuous reading in response to H level of the chip select signal CS. In the flash memory 100, the column address when the chip select signal CS is changed into H level (i.e., the column address of the last outputted data) is, for example, held in an address counter of the column select circuit 190, and the data is outputted from the next column address of the held column address when the continuous reading is resumed.

In Reading period 2, the host device 20 asserts the chip select signal CS to low level when the processing of the CPU is ended. At the time, since the flash memory 100 is able to resume the continuous reading mode, the host device 20 does not request for inputting of the page data read command "13h" and the page address PA. Therefore, the command and the (dummy) address for the continuous reading can be inputted immediately without waiting for the latency Lat equivalent to the period for reading the page data from the memory cell array 110. The control element 150 serially outputs the next data (Dout m+1) of the last outputted data in the previous continuous reading in response to said command (Reading period 2). Later, similarly, the continuous reading mode is still resumed even if the chip select signal CS is toggled, such that the continuous reading can be performed without the page data read "13h" and the page address PA being inputted until the page of MSP is reached.

In this way, according to the present embodiment, in the case where the continuous reading is within the page range defined by the LSP/MSP, regardless of whether the chip select signal CS is toggled, the continuous reading can be resumed without the page data read command "13h" and the page address PA being inputted. Therefore, compared to the conventional art, the time required for reading data in the continuous reading can be reduced. On the other hand, a processing time of the CPU can be provided to the host device 20 so loadings on the host device 20 can be reduced. As a result, inputting of the specific page data read command "13h" and the page address PA of the NAND flash memory is not required. Accordingly, the compatibility with the NOR serial flash memory can be improved.

Next, the second embodiment of the invention is described. In the foregoing embodiment, the page range based on LSP/MSP is set as the page information. However, in the second embodiment, a burst length for defining a number of pages used in the continuous reading is set as the page information instead. In one referred example, as similar to the first embodiment (referring to FIG. 7), the burst length is stored in the page information storage element 160 by serially inputting a page address (e.g., 16-bit) for setting the burst length in subsequent to the command for setting the page information.

Figure 1B:
FIG. 1(B) is a diagram roughly illustrating the continuous reading operation of the NAND flash memory corresponding to the serial interface.
Figure 10:
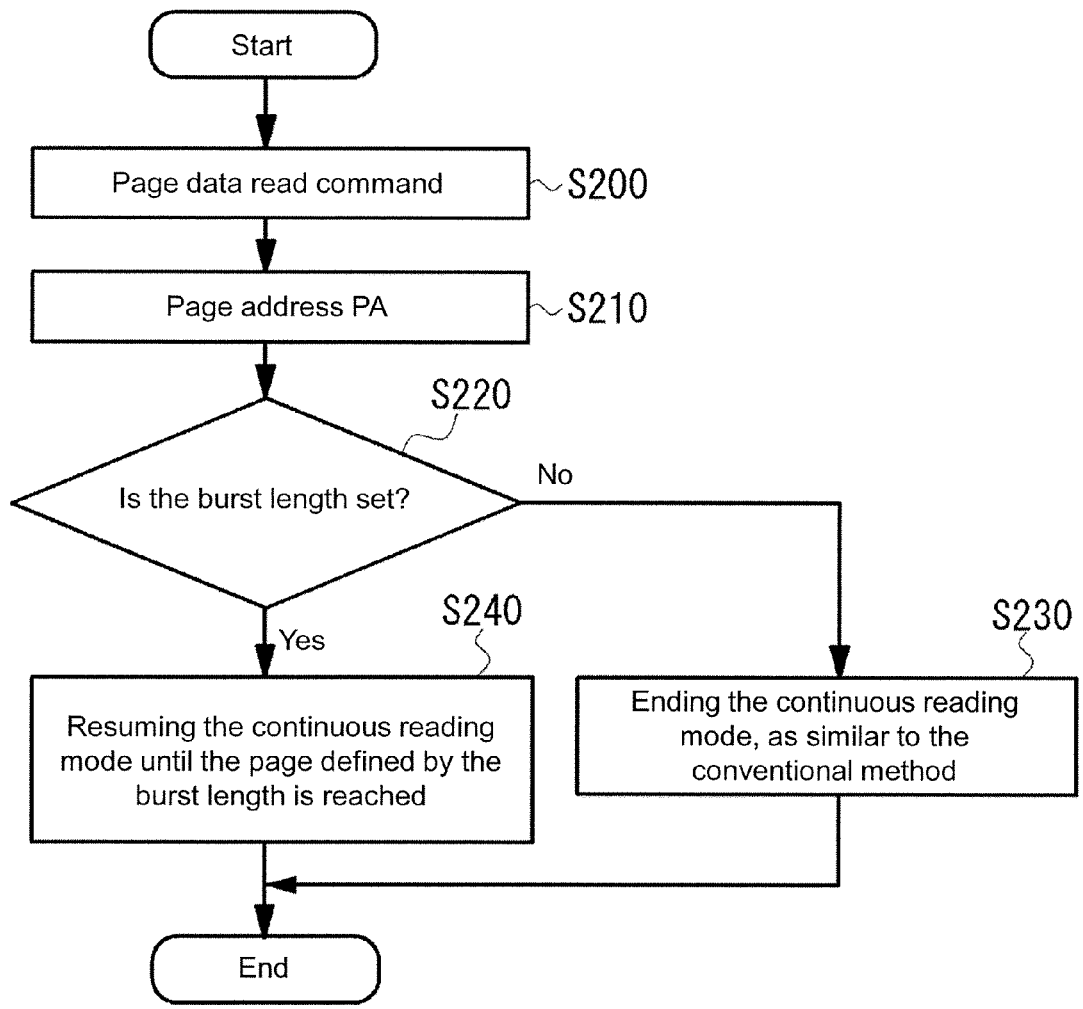
FIG. 10 is a flowchart illustrating the continuous reading operation of the flash memory according to the second embodiment of the invention.

FIG. 10 is a flowchart illustrating the continuous reading operation according to the second embodiment. When inputting the page data read command "13h" and the page address PA (S200 and S210), the control element 150 determines whether the page information storage element 160 is set with the burst length (S220). If the burst length is not set, as shown in FIG. 1(B), the continuous reading mode is ended as similar to the conventional method (S230). On the other hand, if the burst length is set, the control element 150 resumes the continuous reading mode within the page range defined by the burst length, starting from the inputted page address PA (S240). That is to say, in the period where the continuous reading mode is resumed, regardless of whether the chip select signal CS is toggled, the host device 20 does not request for inputting of the page data read command "13h" and the page address PA but performs the continuous reading according to the timing chart shown in FIG. 9(A). For example, if the number of pages is set as 10 by the burst length and "10" is inputted as the page address PA, the flash memory 100 enables the increment on the page addresses starting from the page "10" until "20". In this period, reading based the continuous reading mode is performed.

Next, the third embodiment of the invention is described below. The flash memory 100 is provided with the following function of: when the power is on, automatically reading out data of a page predetermined by the memory cell array, as a power up sequence, to the page buffer/sense circuit 180. For example, in the power up sequence, a configuration register is first accessed to start operations according to structural information stored therein, where the structural information is set with a page address firstly read from the memory cell array when the power is on. In the third embodiment, the control element 150 uses the page address firstly read from the memory cell array (hereinafter, also known as a starting page address for illustrative convenience) in the power up sequence on the LSP and the page address PA.

Figure 11:
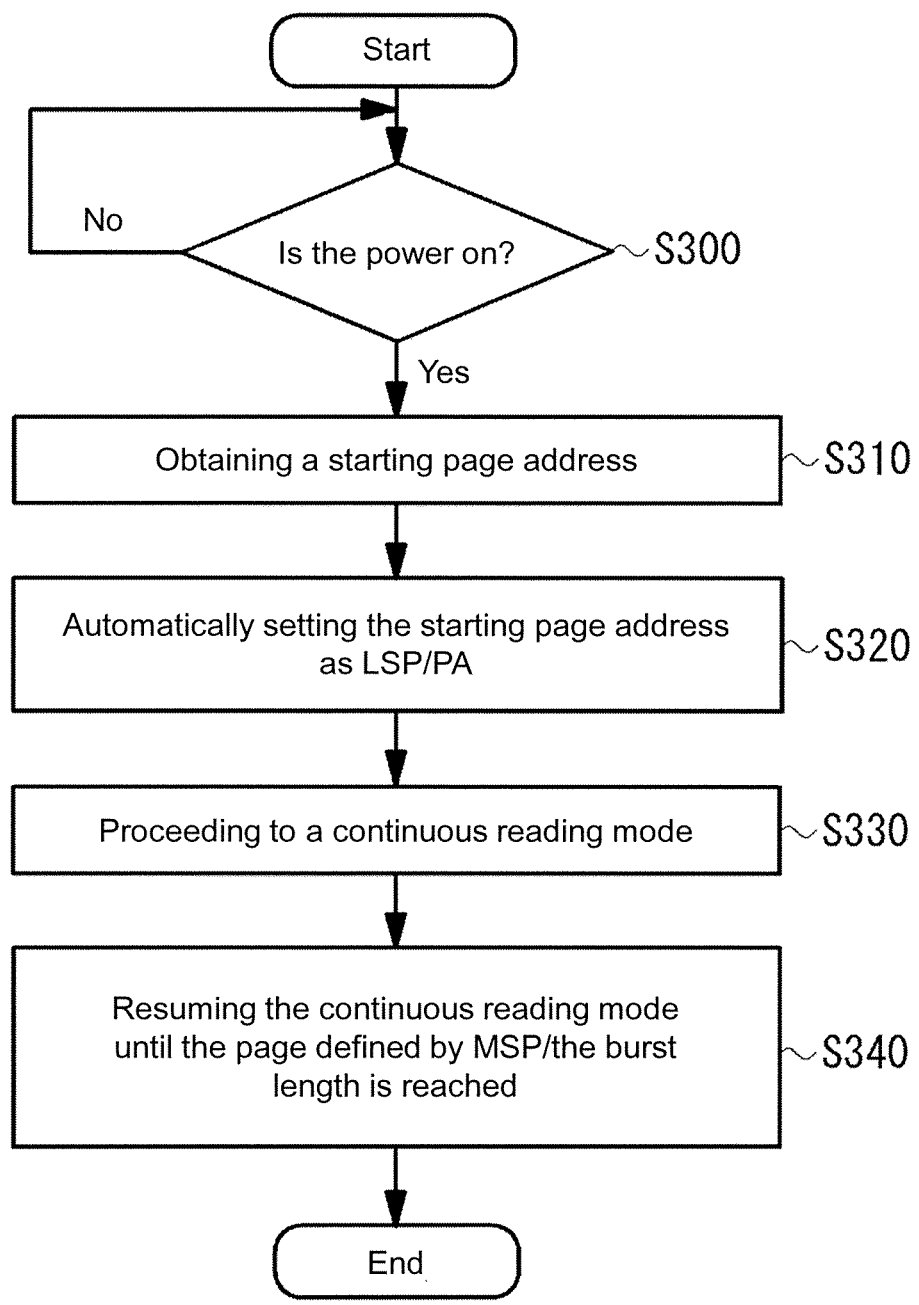
FIG. 11 is a flowchart illustrating the continuous reading operation of the flash memory according to the third embodiment of the invention.

FIG. 11 is a flowchart illustrating the continuous reading operation of the third embodiment. The control element 150 monitors whether the power is on (S300), and obtains the starting page address obtained in the power up sequence when the power is on (S310). Next, the control element 150 automatically sets the starting page address as LSP and the page address PA of the page information (S320), and proceeds to a continuous reading mode (S330). Here, the host device 20 does not input the page data read command "13h"

and the page address PA to the flash memory 100 but inputs the command (e.g., "03h") to be used in the continuous reading instead. By doing so, the flash memory 100 is able to start the continuous reading. In addition, because the starting page address is used as the page address PA, the address inputted subsequent to the read command is dummy (empty). Then, the control element 150 resumes the continuous reading mode, starting from the starting page address to the page range defined by MSP the case of the first embodiment) or from the starting page address to the page address defined by the burst length (in the case of the second embodiment) (S340).

Figure 9B:
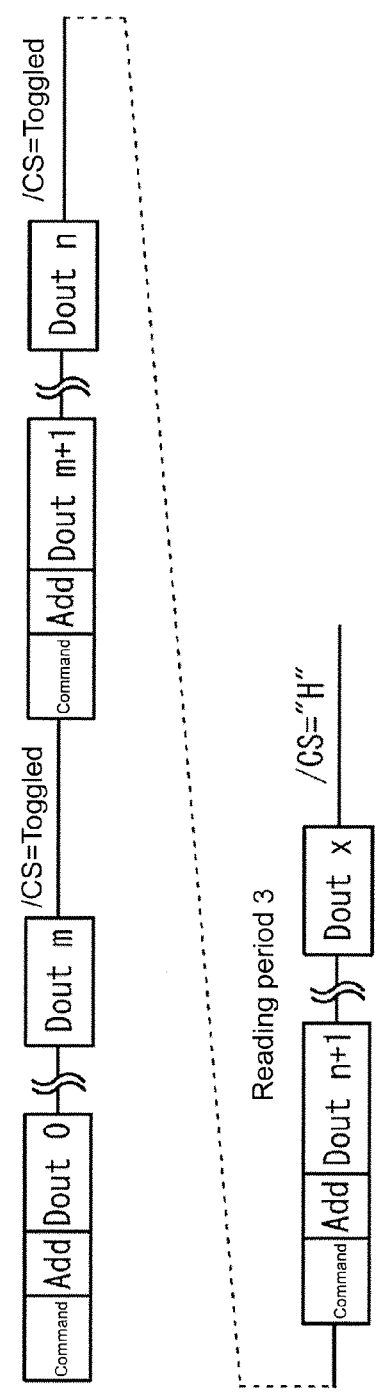

FIG. 9(B) is a flowchart illustrating the continuous reading operation of the third embodiment. Herein, it should be noted, in (the first) Reading period 1, unlike the situations of the first embodiment and the second embodiment, inputting of the page data read command "13h" and the page address PA is not required. As such, according to the third embodiment, the time required by the continuous reading can be further reduced, the loadings of the host device can be reduced and the compatibility with the NOR serial flash memory can be further improved.

The continuous reading mode of the NAND flash memory with the serial interface in the conventional art is ended when the chip select signal CS is disabled. In contrast, as long as the reading is within the set page range, the continuous reading mode can be resumed in the NAND flash memory with the serial interface in the present embodiment. Even if the chip select signal is toggled, the data of the selected page of the memory cell array is still held in the page buffer/sense circuit 180, and the data of the data register 130 is also held. As a result, inputting of the page data read command "13h" and the page address PA can be avoided.

Moreover, the invention is suitable for the flash memory in which memory cells storing binary data or the flash memory in which memory cells storing multi-value data. Furthermore, the invention is also suitable for the 2D flash memory in which the NAND strings of the memory array are formed on the surface of the substrate or the 3D flash memory in which the NAND strings are formed on the conductive layer (e.g., a poly-silicon layer) on the surface of the substrate.

It will be apparent to those skilled in the art that various modifications and variations can be made to the structure of the present invention without departing from the scope or spirit of the present disclosure. In view of the foregoing, it is intended that the present disclosure cover modifications and variations of this disclosure provided they fall within the scope of the following claims and their equivalents.

What is claimed is:

1. A semiconductor memory device, comprising:
an input/output buffer, receiving an external control signal;
a memory cell array;
a word line select circuit, for selecting a page of the memory cell array and reading out data of the selected page to a page buffer; and
a controller, for setting page information related to a range of a continuous reading of the page and controlling the continuous reading of the page of the word line select circuit,
wherein the controller determines whether to resume a continuous reading mode based on the page information,
wherein if determining to resume the continuous reading mode, the controller stores a page address and a column address when the external control signal is disabled and continues to hold the data read out by the word line select circuit, and the controller outputs the data read out by the word line select circuit based on the stored page address and the column address when the external control signal is enabled.

2. The semiconductor memory device according to claim 1, wherein
the controller determines to resume the continuous reading mode when the page selected by the word line select circuit is within a page range defined by the page information, and the controller determines not to resume the continuous reading mode when the selected page is outside the page range.

3. The semiconductor memory device according to claim 1, wherein
if determining not to resume the continuous reading mode, the controller ends the continuous reading in response to the external control signal being disabled, and if determining to resume the continuous reading mode, the controller is capable of performing the continuous reading without a page data read command being inputted when the external control signal being disabled is immediately enabled.

4. The semiconductor memory device according to claim 1, wherein
the controller performing an operation of storing the page information in a page information storage part.

5. The semiconductor memory device according to claim 1, wherein
the controller sets at least one pair of a minimum page address and a maximum page address as the page information.

6. The semiconductor memory device according to claim 1, wherein
the controller sets a burst length for defining a number of pages used in the continuous reading as the page information.

7. The semiconductor memory device according to claim 1, wherein
a page firstly selected by the word line select circuit during the continuous reading is designated based on the page address being inputted.

8. The semiconductor memory device according to claim 1, wherein
a page firstly selected by the word line select circuit during the continuous reading is designated based on a predetermined page address.

9. The semiconductor memory device according to claim 8, wherein
the predetermined page address is a page address firstly read out from the memory cell array when a power is on.

10. The semiconductor memory device according to claim 1, wherein
the semiconductor memory device further comprises:
an output buffer, for serially outputting data of the continuous reading in response to an external serial clock.

11. The semiconductor memory device according to claim 10, wherein
the output buffer comprises a data register, the data register holding data forwarded from the page buffer, the data of the selected page of the memory cell array being held in the page buffer during a period when data is outputted from the data register.

12. The semiconductor memory device according to claim 1, wherein the semiconductor memory device is an NAND flash memory.

13. A flash memory, comprising:
an input/output buffer, receiving an external control signal;
an NAND memory cell array;
a page buffer, for holding data forwarded from a selected page of the memory cell array or holding to-be-programmed data;
a data register, capable of performing a bidirectional data transceiving with the page buffer; and
a controller, for continuously reading out a page of the memory cell array and serially outputting read data through the data register in synchronism with a serial clock and setting page information related to a range of a continuous reading,
wherein the controller being capable of performing the continuous reading within a page range defined by the page information without a page data read command,
wherein if determining to resume a continuous reading mode, the controller stores a page address and a column address when the external control signal is disabled and continues to hold data read out by a word line select circuit, and the controller outputs the data read out by the word line select circuit based on the stored page address and the column address when the external control signal is enabled.

14. The flash memory according to claim 13, wherein the flash memory is set active in response to a logic level of an external control signal, and the controller still resumes a continuous reading mode even if the external control signal is toggled.

15. A continuous reading method of a flash memory, comprising:
receiving, by an input/output buffer, an external control signal;
setting page information related to a range of a continuous reading;
performing the continuous reading without a page data read command even if the external control signal is disabled when the continuous reading is performed within the range defined by the page information; and
if determining to resume a continuous reading mode, storing a page address and a column address when the external control signal is disabled and continues to hold data read out by a word line select circuit, and outputting the data read out by the word line select circuit based on the stored page address and the column address when the external control signal is enabled.

16. The continuous reading method according to claim 15, wherein
the continuous reading method further comprises:
serially outputting page data in synchronism with a serial clock.

17. A semiconductor memory device, comprising:
a memory cell array;
a word line select circuit, for selecting a page of the memory cell array and reading out data of the selected page to a page buffer; and
a controller, for setting page information related to a range of a continuous reading of the page and controlling the continuous reading of the page of the word line select circuit,
wherein the controller determines a continuous reading mode is resumed based on the page information,
wherein a page firstly selected by the word line select circuit during the continuous reading is designated based on a predetermined page address,
the predetermined page address is a page address firstly read out from the memory cell array when a power is on.

18. The semiconductor memory device according to claim 17, wherein
the controller sets at least one pair of a minimum page address and a maximum page address as the page information.

19. The semiconductor memory device according to claim 17, wherein
the controller sets a burst length for defining a number of pages used in the continuous reading as the page information.

* * * * *